(12) United States Patent
Jiang et al.

(10) Patent No.: US 10,194,547 B2
(45) Date of Patent: Jan. 29, 2019

(54) ELECTRONIC PRODUCT METAL SHELL WITH AN ANTENNA GROOVE AND METHOD OF MANUFACTURING THE SAME

(71) Applicant: BYD COMPANY LIMITED, Shenzhen, Guangdong (CN)

(72) Inventors: Baorong Jiang, Shenzhen (CN); Chongchong Liao, Shenzhen (CN); Aihua Li, Shenzhen (CN); Liang Chen, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 15/631,915

(22) Filed: Jun. 23, 2017

(65) Prior Publication Data

US 2017/0288720 A1 Oct. 5, 2017

Related U.S. Application Data

(63) Continuation of application No. PCT/CN2015/092723, filed on Oct. 23, 2015.

(30) Foreign Application Priority Data

Dec. 26, 2014 (CN) .......................... 2014 1 0837112

(51) Int. Cl.
*H05K 5/04* (2006.01)
*C23F 1/28* (2006.01)
(Continued)

(52) U.S. Cl.
CPC ................. *H05K 5/04* (2013.01); *C23F 1/28* (2013.01); *C25D 11/022* (2013.01); *H01Q 1/243* (2013.01);
(Continued)

(58) Field of Classification Search
CPC ........................... H04M 1/026; H04M 1/0283
(Continued)

(56) References Cited

U.S. PATENT DOCUMENTS

2010/0255274 A1 10/2010 Mirsky et al.
2011/0273350 A1 11/2011 McQuaid
(Continued)

FOREIGN PATENT DOCUMENTS

CN 1490431 A 4/2004
CN 101466214 A 6/2009
(Continued)

OTHER PUBLICATIONS

International Search Report and Written Opinion for Application No. PCT/CN2015/092823, dated Jan. 14, 2016, 10 pages.

*Primary Examiner* — John J Lee
(74) *Attorney, Agent, or Firm* — Sheppard Mullin Richter & Hampton LLP

(57) ABSTRACT

The present disclosure provides an electronic product metal shell with an antenna groove and a method of manufacturing the same. The electronic product metal shell includes a metal layer, a hard anodic oxidation layer, a step recess, an antenna groove and a non-conductive material filled in the antenna groove. The metal layer may have a first surface and a second surface. The hard anodic oxidation layer may be coated on the first surface and the second surface of the metal layer. The step recess may be formed through the hard anodic oxidation layer on the first surface of the metal layer and partially into the metal layer. The antenna groove may be formed within the step recess extending through the metal layer to expose an inner side of the hard anodic oxidation layer on the second surface of the metal layer.

20 Claims, 3 Drawing Sheets

(51) Int. Cl.
*C25D 11/02* (2006.01)
*H01Q 1/24* (2006.01)
H04M 1/02 (2006.01)
H05K 3/06 (2006.01)

(52) U.S. Cl.
CPC .......... *H04M 1/0202* (2013.01); *H04M 1/026* (2013.01); *H04M 1/0283* (2013.01); *H05K 3/067* (2013.01)

(58) Field of Classification Search
USPC .............. 455/66.1, 575.1, 575.5, 90.3, 67.11
See application file for complete search history.

(56) References Cited

U.S. PATENT DOCUMENTS

| | | | |
|---|---|---|---|
| 2013/0049557 A1 | 2/2013 | Ho et al. | |
| 2014/0126172 A1* | 5/2014 | Fahlgren | H01Q 1/243 361/814 |
| 2014/0131208 A1 | 5/2014 | Chien et al. | |
| 2014/0228080 A1 | 8/2014 | Choi et al. | |
| 2014/0363623 A1* | 12/2014 | Sun | C25D 11/08 428/119 |
| 2017/0093022 A1* | 3/2017 | Cai | H01Q 13/10 |

FOREIGN PATENT DOCUMENTS

| | | |
|---|---|---|
| CN | 102039699 A | 5/2011 |
| CN | 102958311 A | 3/2013 |
| CN | 103987223 A | 8/2014 |
| CN | 104066293 A | 9/2014 |
| TW | 201414078 A | 4/2014 |

\* cited by examiner

ELECTRONIC PRODUCT METAL SHELL WITH AN ANTENNA GROOVE AND METHOD OF MANUFACTURING THE SAME

CROSS-REFERENCE TO RELATED APPLICATION

This application is a continuation application of International Application No. PCT/CN2015/092723, filed on Oct. 23, 2015, which is based on and claims priority to and benefits of Chinese Patent Application No. 201410837112.2, filed with the State Intellectual Property Office (SIPO) of the People's Republic of China on Dec. 26, 2014. The entire contents of the above-identified applications are incorporated herein by reference.

FIELD

Examples of the present disclosure generally relate to the field of electronic product manufacturing technology, and more particularly to an electronic product metal shell having an antenna groove and a method of manufacturing the same.

BACKGROUND

Currently, in order to solve problems of signal shielding caused by shell, electronic products, such as metal cell phone, mostly adopt a method of slotting on a rear cover of the cell phone and then injecting molding. For example, HTC ONE has an upper and a lower antenna slot, iPhone 5/5s has a side antenna slot, etc. However, the method of slotting an antenna slot on electronic product metal shell (for example, rear cover of the metal cell phone) and then injecting molding stated above may cause some damages to the whole structure of the electronic product metal shell, and affect cleanliness and integrity of appearance of the electronic product metal shell. Meanwhile, a visible plastic of the electronic product metal shell (for example, rear cover of the metal cell phone) would also damage a metal texture of the whole electronic product metal shell.

SUMMARY

The present disclosure seeks to solve the problem that the method in prior art that slotting an antenna slot on the electronic product metal shell and then injection molding may influence cleanliness and integrity of appearance of the electronic product metal shell and damage a metal texture of the whole electronic product metal shell, and thus provide an electronic product metal shell having an antenna groove and a method of manufacturing the same. The antenna groove formed on the electronic product metal shell of the present disclosure is not visible on appearance via naked eye. The appearance of the surface of the electronic product metal shell won't be damaged, the appearance surface of an aluminum shell is smooth and tidy, which may maintain a cleanliness and integrity of appearance of the electronic product metal shell and won't damage a metal texture of the whole electronic product metal shell.

Thus, in order to achieve objectives stated above, examples of a first aspect of the present disclosure provide electronic product metal shell having an antenna groove. The electronic product metal shell includes a metal layer and a hard anodic oxidation layer; wherein the hard anodic oxidation layer is coated on surface of the metal layer; a step recess is formed on a first surface of the electronic product metal shell; the step recess penetrates through the hard anodic oxidation layer coated on a first surface of the metal layer and part of the metal layer in a thickness direction of the electronic product metal shell; the antenna groove is disposed within the step recess and penetrates through residual part of the metal layer in the thickness direction so as to expose an inner side of the hard anodic oxidation layer coated on a second surface of the metal layer; and a non-conductive material is filled in the antenna groove.

Examples of a second aspect of the present disclosure provide a method of manufacturing an electronic product metal shell having an antenna groove. The method includes steps of:

(1) applying a hard anodizing treatment and an ink spraying treatment to a metal layer in sequence, so as to form a hard anodic oxidation layer and an ink layer respectively;

(2) forming a step recess through the hard anodic oxidation layer on a first surface of the metal layer and partially into the metal layer, and an antenna groove disposed within the step recess and extending through the metal layer to expose an inner side of the hard anodic oxidation layer on a second surface of the metal layer;

(3) removing the ink layer; and (4) filling a non-conductive material in the antenna groove.

Examples of a second aspect of the present disclosure provide an electronic product metal shell. The electronic product metal shell is obtained via the method stated above.

The antenna groove formed on the electronic product metal shell of the present disclosure is not visible on appearance via naked eye. The appearance of the surface layer of the electronic product metal shell will not be damaged, the appearance surface of the aluminum shell is smooth and tidy, which may maintain a cleanliness and integrity of appearance of the electronic product metal shell and will not damage a metal texture of the whole electronic product metal shell.

These and other aspects and advantages of examples of the present disclosure will be described in detail with reference to the following detail description.

DETAILED DESCRIPTION

Figure 1:
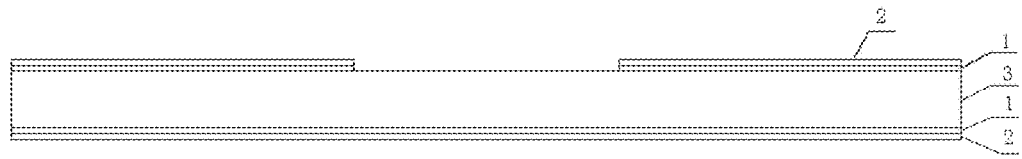
FIG. 1 is a sectional structure schematic view of the aluminum shell after removing the ink layer and the hard anodic oxidation layer corresponding to the step recess pattern of Example 1 of the present disclosure.

Reference will be made in detail to examples of the present disclosure. The examples described herein are explanatory and illustrative, which are used to generally understand the present disclosure. The examples shall not be construed to limit the present disclosure.

According to a first aspect of examples of the present disclosure, an electronic product metal shell is provided, the electronic product metal shell includes a metal layer 3 and a hard anodic oxidation layer 1; the hard anodic oxidation layer 1 is coated on a first surface and a second surface of the metal layer; a step recess 4 is formed on a first surface of the electronic product metal shell; the step recess penetrates through the hard anodic oxidation layer coated on the first surface of the metal layer and a first part of the metal layer in a thickness direction of the electronic product metal shell; the antenna groove 5 is disposed within the step recess and penetrates through a second part of the metal layer in the thickness direction so as to expose an inner side of the hard anodic oxidation layer coated on the second surface of the metal layer; and a non-conductive material is filled in the antenna groove.

In some examples of the present disclosure, the step recess 4 includes a recess having a width of about 1.0 centimeter to about 5.0 centimeters and a depth of about 0.1 millimeters to about 0.8 millimeters. For example, in one example, the recess has a depth of about 0.3 millimeters to about 0.5 millimeters.

In some examples of the present disclosure, an opening of the antenna groove 4 facing the first surface of the electronic product metal shell is defined as an upper opening. The antenna groove 5 has a sectional structure of trapezoid that the upper opening has a size larger than a lower opening of the antenna groove, the upper opening has a width of about 2 millimeters to about 5 millimeters, for example, about 2 millimeters to about 5 millimeters, and the lower opening has a width of about 0.8 millimeters to about 1.4 millimeters, for example, about 0.8 millimeters to about 1.2 millimeters.

In some examples of the present disclosure, the metal layer 3 has a thickness of about 0.5 millimeters to about 1.5 millimeters, for example, about 0.5 millimeters to about 0.6 millimeters, and the hard anodic oxidation layer 1 has a thickness of about 0.02 millimeters to about 0.06 millimeters, for example, about 0.04 millimeters to about 0.06 millimeters.

In some examples of the present disclosure, the metal layer 3 includes an aluminum alloy layer.

In some examples of the present disclosure, the electronic product metal shell includes a cell phone metal shell or a tablet computer metal shell.

According to a second aspect of examples of the present disclosure, a method of manufacturing an electronic product metal shell with an antenna groove is provided. The method of manufacturing an electronic product metal shell with an antenna groove includes steps of:

(1) applying a hard anodizing treatment and an ink spraying treatment to a metal layer in sequence, so as to form a hard anodic oxidation layer and an ink layer respectively;

(2) forming a step recess on a first surface of a first product obtained after step (1) and forming an antenna groove within the step recess, the step recess running through the hard anodic oxidation layer coated on a first surface of the metal layer and a first part of the metal layer in a thickness direction of the first product, and the antenna groove running through a second part of the metal layer in the thickness direction so as to expose an inner side of the hard anodic oxidation layer coated on a second surface of the metal layer; and (3) removing the ink layer of a second product obtained after step (2) and filling a non-conductive material in the antenna groove.

In some examples, in step (1), the hard anodizing treatment includes: subjecting the metal layer to an alkaline etching treatment, a desmutting treatment, an oxidizing treatment and a sealing treatment in sequence, and washing the metal layer after each one of the alkaline etching treatment. In examples of the present disclosure, there is no particular limitation for the method of washing, it could be any commonly used washing method in the art, for example, washing by deionized water for 2-3 times. The method of hard anodizing treatment is not to be limited in scope by the specific preferred embodiments disclosed herein.

In some embodiments, the alkaline etching treatment is carried out under conditions of: a temperature of about 50 Celsius degrees to about 70 Celsius degrees, for about 1 minute to about 2 minutes, an etching solution having a concentration of about 30 g/L to about 60 g/L and including at least one selected from a group consisting of sodium hydroxide, potassium hydroxide and lithium hydroxide. The method of alkaline etching treatment is not to be limited in scope by the specific preferred embodiments disclosed herein.

In some examples, the desmutting treatment is carried out under conditions of: a temperature of about 20 Celsius degrees to about 30 Celsius degrees, for about 1 minute to about 3 minutes, a desmutting solution including nitric acid aqueous solution. Per one liter of the desmutting solution, the nitric acid has a content of about 130 grams to about 270 grams (which is substantially equivalent to about 200 mL to about 400 mL of concentrated nitric acid having a concentration of about 65 wt % to about 68 wt %). The method of desmutting treatment is not to be limited in scope by the specific preferred embodiments disclosed herein.

In some examples, the oxidizing treatment is carried out under conditions of: a temperature of about 5 Celsius degrees to about 12 Celsius degrees for about 30 minutes to about 50 minutes, an impulse waveform of positive square wave pulse, a duty ratio of about 50% to about 90%, a frequency of about 500 Hz to about 1000 Hz, a current density of about 2 A/dm$^2$ to about 7 A/dm$^2$, an oxidant solution including an aqueous solution of sulfuric acid, oxalic acid/malic acid. Per 1 liter of the oxidant solution, the sulfuric acid has a content of about 120 grams to 220 grams, the oxalic acid or the malic acid has a content of about 8 grams to about 20 grams. The oxidant solution including an aqueous solution of sulfuric acid, oxalic acid/malic acid refers to a solution including sulfuric acid and oxalic acid, or a solution including sulfuric acid and malic acid. The method of oxidizing treatment is not to be limited in scope by the specific preferred embodiments disclosed herein.

In some examples, the conditions of sealing treatment includes: a temperature of about 20 Celsius degrees to about 30 Celsius degrees and about 2 minutes to about 3 minutes. In some examples, a sealant includes at least one selected from a group consisting of nickel-free sealant, sealant with trace nickel and heavy metal-free sealant. The method of sealing treatment is not to be limited in scope by the specific preferred embodiments disclosed herein. For those skilled in the art, the hard anodizing treatment includes a washing treatment after the sealing treatment, and a hard anodic oxidation layer is formed by blow-drying after the washing treatment. In some embodiments, the blow-drying may be carried out with an oil-free compressed gas at a temperature of about 20 Celsius degrees to about 30 Celsius degrees for about 5 minutes to about 10 minutes, which is well known by those skilled in the art, and therefore detailed description is omitted herein. The method of blow-drying is not to be limited in scope by the specific preferred embodiments disclosed herein.

In examples of the present disclosure, the ink layer 2 is formed on a first and a second surface of the product obtained after the hard anodizing treatment.

In examples of the present disclosure, there is no particular limitation for the process of the ink spraying treatment, it could be any commonly used ink spraying treatment in the art. In some examples, the ink spraying treatment includes: spraying a UV ink to form a ink layer having a thickness of about 30 microns to about 60 microns, then baking under about 110 Celsius degrees to about 120 Celsius degrees for about 20 minutes to about 30 minutes, and exposing under ultraviolet ray for about 1 minute to about 2 minutes.

In examples of the present disclosure, for those skilled in the art, it should be understand that the second surface of the electronic product metal shell refers to a surface of the electronic product metal shell that exposed in the air when the electronic product metal shell is assembled in a finished electronic product, and the first surface is a surface of the electronic product metal shell that opposite to the second surface.

In examples of the present disclosure, alternatively, in step (2), forming the step recess includes: forming a step recess pattern on the first surface of the first product obtained after step (1), removing the ink layer and the hard anodic oxidation layer corresponding to the step recess pattern, and removing the part of the metal layer in a thickness direction of the metal layer to obtain the step recess.

In examples of the present disclosure, in order to reduce destruction on structure of the electronic product metal shell, guarantee that no convex mark would be formed on the second surface of the electronic product metal shell, and further improve a solidity and hardness, alternatively, after removing part of the metal layer, the residual part of the metal layer has a thickness of about 20% to about 80% of an overall thickness of the metal layer, preferably about 20% to about 40%.

In examples of the present disclosure, alternatively, the step recess formed has a width of about 1.0 centimeter to about 5.0 centimeters and a depth of about 0.1 millimeters to about 0.8 millimeters. For example, the recess may have a depth of about 0.3 millimeters to about 0.5 millimeters.

In examples of the present disclosure, alternatively, the step recess pattern is formed on the first surface of the first product obtained after step (1) via radium carving. For example, the radium carving may be carried out by a radium carving machine, it is well known by those skilled in the art, thus detailed description is omitted herein. The method of radium carving is not to be limited in scope by the specific preferred embodiments disclosed herein.

In examples of the present disclosure, alternatively, the part of the metal layer is removed in the thickness direction of the metal layer via etching. For example, in some examples of the present disclosure, the acid etching solution may include a ferric trichloride-type acid etching solution, copper chloride-type acid etching solution or hydrochloric acid-type acid etching solution. Alternatively, conditions of the etching includes: a temperature of about 20 Celsius degrees to about 30 Celsius degrees, for about 40 minutes to about 50 minutes, with an etching solution including an aqueous solution having ferric trichloride and hydrochloric acid. Per one liter of the etching solution, the ferric trichloride has a content of about 800 grams to about 1000 grams, and the hydrochloric acid has a content of about 35 grams to about 75 grams (which is substantially equivalent to about 100 mL to about 200 mL of hydrochloric acid having a concentration of about 36 wt % to about 38 wt %). For those skilled in the art that, the time of etching bears on the thickness of the metal layer that needed to be removed, the greater the thickness of the metal layer that needed to be removed is, the more time of etching is needed, on the contrary, the lower the thickness of the metal layer that needed to be removed is, the less time of etching is needed. The method of etching is not to be limited in scope by the specific preferred embodiments disclosed herein.

In some examples of the present disclosure, alternatively, in step (2), forming the antenna groove within the step recess includes: spraying ink on the step recess, forming an antenna groove slit within the step recess so as to remove the ink corresponding to the antenna groove slit, and removing the metal layer corresponding to the antenna groove slit to expose the inner side of the hard anodic oxidation layer coated on the second surface of the metal layer.

In some examples of the present disclosure, in step (2), there is no particular limitation for the method of spraying ink, it could be any commonly used method of spraying ink in the art. Alternatively, in step (2), spraying ink includes: spraying a UV ink to form an ink layer having a thickness of about 30 microns to about 60 microns, then baking under about 110 Celsius degrees to about 120 Celsius degrees for about 20 minutes to about 30 minutes, and exposing under ultraviolet ray for about 1 minute to about 2 minutes.

In some examples of the present disclosure, alternatively, in step (2), the antenna groove slit formed has a width of about 0.02 millimeters to about 0.1 millimeters.

In some examples of the present disclosure, alternatively, in step (2), the metal layer corresponding to the antenna groove slit is removed via etching, a condition of the etching includes: a temperature of about 20 Celsius degrees to about 30 Celsius degrees, for about 40 minutes to about 50 minutes, an etching solution including an aqueous solution having ferric trichloride and hydrochloric acid. Per one liter of the etching solution, the ferric trichloride has a content of about 800 grams to about 1000 grams, and the hydrochloric acid has a content of about 35 grams to about 75 grams.

In some examples of the present disclosure, the metal layer may include other metal impurities, such as copper, manganese. Therefore, In some examples of the present disclosure, the method of manufacturing an electronic product metal shell with an antenna groove may further include washing after each etching, peeling black film after washing to remove black impurity layer exposed, and washing again. There is no particular limitation for the method of washing, it could be any commonly used washing method in the art, for example, washing by deionized water for 2-3 times.

In some examples of the present disclosure, the opening of the antenna groove corresponding to the first surface of the electronic product metal shell is defined as an upper opening, the antenna groove has a sectional structure of trapezoid that the upper opening has a size larger than a lower opening of the antenna groove. After part of the metal layer is removed, when the residual part of the metal layer has a thickness of about 20% to about 80% of an overall thickness of the metal layer, the upper opening has a width of about 2 millimeters to about 5 millimeters, and the lower opening has a width of about 0.8 millimeters to about 1.4 millimeter; when the residual part of the metal layer has a thickness of about 20% to about 40% of an overall thickness of the metal layer, the upper opening has a width of about 2 millimeters to about 3 millimeters, and the lower opening has a width of about 0.8 millimeters to about 1.2 millimeter.

In some examples of the present disclosure, for those skilled in the art that, the ink layer removed includes the entire ink layer coated on surface of the electronic product metal shell. Alternatively, the ink layer may be removed by a neutral paint remover. There is no particular limitation for the neutral paint remover, it could be any commonly used neutral paint remover in the art, for example, the neutral paint remover could be at least one selected from a group consisting of general solvent-based paint remover, chlorinated hydrocarbon-type paint remover and aqueous paint remover. The method of removing the ink layer is not to be limited in scope by the specific preferred embodiments disclosed herein.

In some embodiments, the method of manufacturing an electronic product metal shell with an antenna groove may further include: after removing the ink layer and prior to filling the non-conductive material, washing and drying the second product. There is no particular limitation for the method of the drying, it could be any commonly used drying method in the art. For example, the drying is carried out under a condition including: a temperature of about 80 Celsius degrees to about 120 Celsius degrees, and a time of about 5 minutes to about 10 minutes.

Alternatively, there is no particular limitation for the method of filling the non-conductive material and there is no particular limitation for the non-conductive material. Alternatively, the non-conductive material includes at least one selected from a group consisting of UV glue, thermal curing glue, and cold setting adhesive.

In some examples of the present disclosure, in order to enhance the aesthetic effect of the appearance of the electronic product metal shell obtained, the non-conductive material may be filled in the step recess.

In some examples of the present disclosure, the metal layer includes an aluminum alloy layer.

In some examples of the present disclosure, the electronic product metal shell includes a cell phone metal shell or a tablet computer metal shell.

According to a third aspect of the present disclosure, an electronic product metal shell obtained from the method stated above is provided.

EXAMPLES

Examples described hereafter will give further description to the present disclosure, which shall not be construed to limit the present disclosure.

In the examples below, the aluminum material of series 5 having a thickness of 0.5 millimeters is purchased from FUJIAN NANPING ALUMINUM CO., LTD.

The nickel-free sealant, sealant with trace nickel and heavy metal-free sealant are purchased from SHENZHEN ODM TECHNOLOGY CO., LTD.

The chlorinated hydrocarbon paint remover is purchased from DONGGUAN SIHUI SURFACE PROCESSING TECHNOLOGY CO., LTD.

The UV glue is purchased form Japanese ASEC company, the UV glue is AS-210604C.

The radium carving machine is purchased from SHENZHEN GDLASER TECHNOLOGY CO., LTD, The radium carving machine is FM20D.

Example 1

This Example is used to illustrate an aluminum shell having an antenna groove of a phone and a method of manufacturing the same of the present disclosure.

(1) Alkaline etching treatment: A series 5 aluminum layer 3 having a thickness of 0.5 millimeters is cut to form an aluminum plate having a size of 5 centimeters*3.5 centimeters. Then the aluminum plate is subjected to an alkaline etching treatment in a sodium hydroxide solution having a concentration of 40 g/L under 60 Celsius degrees for 1.5 minutes, and then the aluminum plate is washed twice by deionized water.

(2) Desmutting treatment: The aluminum plate obtained from step (1) is subjected to a desmutting treatment in a desmutting solution (per 1 liter of the desmutting solution, a volume of concentrated nitric acid having a concentration of 65 wt % is 300 mL) under 25 Celsius degrees for 2 minutes, and then the aluminum plate is washed twice by deionized water.

(3) Oxidizing treatment: The aluminum plate obtained from step (2) is placed in an oxidation tank so as to conduct an hard oxidizing treatment. The hard oxidizing treatment is carried out under 10 Celsius degrees with a positive square wave pulse, a duty ratio of 50%, a frequency of 800 Hz, and a current density of 2 $A/dm^2$ for 40 minutes (per 1 liter of an oxidant solution, a content of a 98 wt % sulfuric acid is 200 grams, a content of a oxalic acid is 15 grams, and remaining is water), and then the aluminum plate is washed twice by deionized water.

(4) Sealing treatment: The aluminum plate obtained from step (3) is sealed with a nickel-free sealant under 25 Celsius degrees for 2.5 minutes, and then the aluminum plate is washed twice by deionized water, and then the aluminum plate is blow-dried via an oil-free compressed gas under 25 Celsius so as to obtain a hard anodic oxidation layer 1 having a thickness of 35 microns.

(5) Ink spraying treatment: A UV ink is sprayed on surface of the aluminum plate obtained from step (4) to form an ink layer 2 having a thickness of 50 microns, and then the aluminum plate is baked under 115 Celsius degrees for 25 minutes and exposed under ultraviolet ray for 1.5 minutes. A step recess pattern is radium carved on a first surface of the aluminum plate obtained from step (5) via a radium carving machine so as to remove the ink layer and the hard anodic oxidation layer corresponding to the step recess pattern. Then, the aluminum plate is etched in an etching solution (per 1 L etching solution, a content of ferric trichloride hexahydrate is 900 grams, a content of 37 wt % hydrochloric acid is 150 mL, and remaining is water) under 25 Celsius degree for 45 minutes so as to remove a part of aluminum layer (0.3 millimeters) in a thickness direction of the aluminum plate, so as to obtain a step recess 4 having a width of 2.5 centimeters and a depth of 0.3 millimeters. And then the aluminum plate is washed twice by deionized water, and an exposed black impurity layer is peeled away, and then then the aluminum plate is washed twice by deionized water again.

(6) A UV ink is sprayed on the step recess to form an ink layer having a thickness of 40 microns and then the aluminum plate is baked under 115 Celsius degrees for 25 minutes and exposed under ultraviolet ray for 1.5 minutes. Then, an antenna groove slit having a width of 0.06 millimeters is radium carved within the step recess so as to remove the ink layer corresponding to the antenna groove slit, an aluminum layer corresponding to the antenna groove slit is etched under 25 Celsius degrees for 35 minutes with an etching solution (per 1 liter of the etching solution, a content of ferric trichloride hexahydrate is 900 grams, a content of 37 wt % hydrochloric acid is 150 mL, and remaining is water). By observing, an inner side of the hard anodic oxidation layer coated on a second surface of the aluminum plate is exposed.

Then the aluminum plate is washed twice by deionized water, and an exposed black impurity layer is peeled away, and then then the aluminum plate is washed twice by deionized water again. Then an antenna groove having a sectional structure of trapezoid that the upper opening has a size larger than that of a lower opening of the antenna groove is obtained, the upper opening has a width of 3 millimeters, and the lower opening has a width of 1.2 millimeters.

(7) The ink layer on a rear surface of the aluminum plate is removed via a chlorinated hydrocarbon solvent paint remover, and then the aluminum plate is washed twice by deionized water and baked under 100 Celsius degrees for 7 minutes.

(8) A UV glue is filled within the antenna groove.

Figure 2:
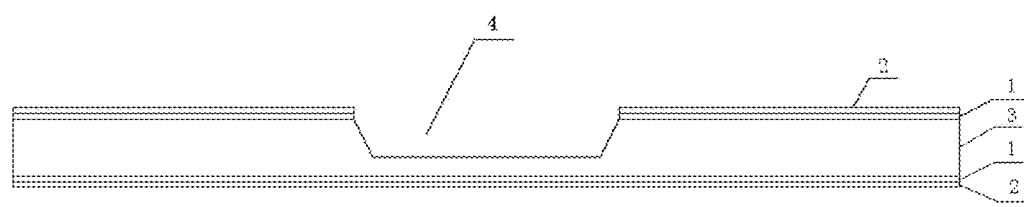
FIG. 2 is a sectional structure schematic view of the aluminum shell after removing part of aluminum layer to obtain the step recess of Example 1 of the present disclosure.
Figure 3:
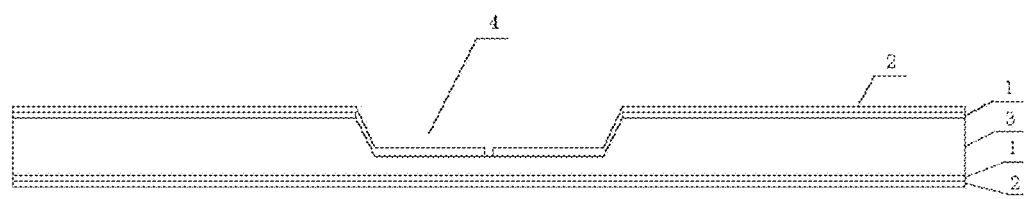
FIG. 3 is a sectional structure schematic view of the aluminum shell after radium carving the antenna groove slit and removing the ink layer corresponding to the antenna groove slit of Example 1 of the present disclosure.
Figure 4:
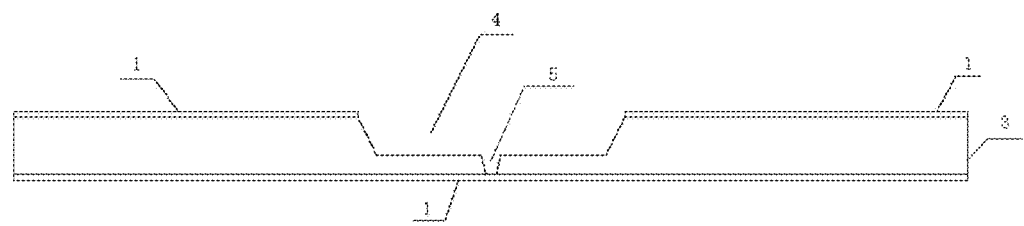
FIG. 4 is a sectional structure schematic view of the aluminum shell after removing the ink layer of Example 1 of the present disclosure.
Figure 5:
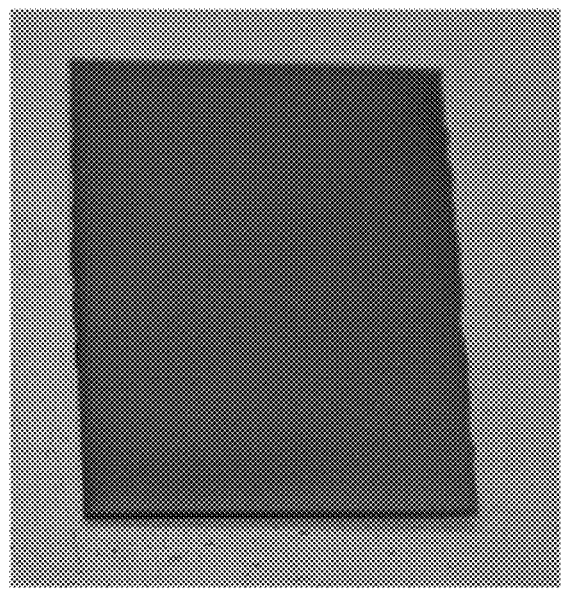
FIG. 5 is a sectional structure schematic view of the aluminum shell after forming the ink layer of Example 1 of the present disclosure.
Figure 6:
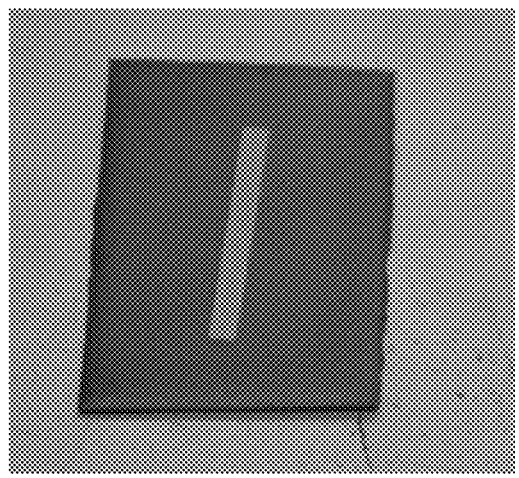
FIG. 6 is a picture of the aluminum shell after radium carving the step recess pattern of Example 1 of the present disclosure.
Figure 7:
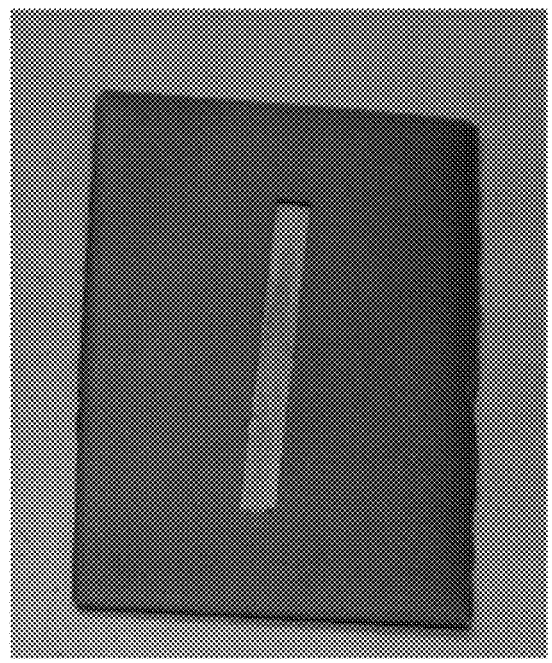
FIG. 7 is a picture of the aluminum shell after etching the step recess of Example 1 of the present disclosure.
Figure 8:
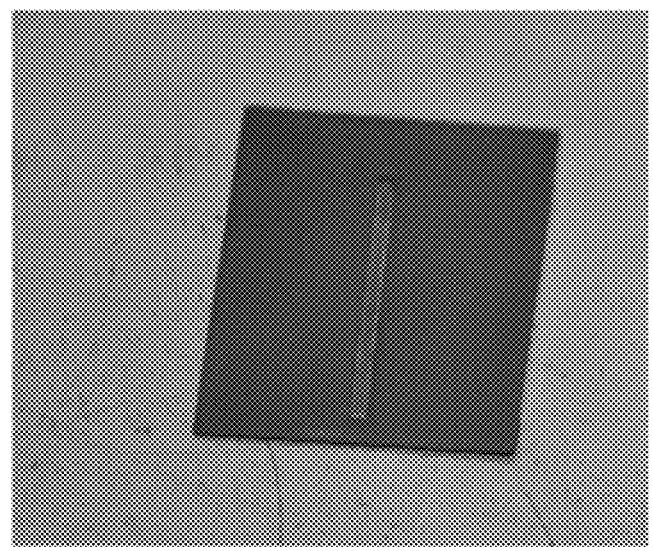
FIG. 8 is a picture of the aluminum shell after radium curing the antenna groove slit of Example 1 of the present disclosure.

In this Example, a sectional structure schematic view of the aluminum shell after removing the ink layer and the hard anodic oxidation layer corresponding to the step recess pattern is shown in FIG. 1, a sectional structure schematic view of the aluminum shell after removing part of aluminum layer to obtain the step recess is shown in FIG. 2, a sectional structure schematic view of the aluminum shell after radium carving the antenna groove slit and removing the ink layer corresponding to the antenna groove slit is shown in FIG. 3, a sectional structure schematic view of the aluminum shell after removing the ink layer is shown in FIG. 4, a sectional structure schematic view of the aluminum shell after forming the ink layer is shown in FIG. 5, a picture of the aluminum shell after radium carving the step recess pattern is shown in FIG. 6, a picture of the aluminum shell after etching the step recess is shown in FIG. 7 and a picture of the aluminum shell after radium curing the antenna groove slit is shown in FIG. 8.

The antenna groove formed on the aluminum shell according to this Example is not visible on appearance via naked eye. The appearance of the surface layer of the aluminum shell won't be damaged, the appearance surface of the aluminum shell is smooth and tidy, which may maintain a cleanliness and integrity of appearance of the phone body and will not damage a metal texture of the whole phone body.

Example 2

This Example is used to illustrate an aluminum shell having an antenna groove of a phone and a method of manufacturing the same of the present disclosure.

(1) Alkaline etching treatment: A series 5 aluminum layer 3 having a thickness of 0.5 millimeters is cut to form an aluminum plate having a size of 5 centimeters*3.5 centimeters. Then the aluminum plate is subjected to an alkaline etching treatment in a potassium hydroxide solution having a concentration of 30 g/L under 50 Celsius degrees for 2 minutes, and then the aluminum plate is washed twice by deionized water.

(2) Desmutting treatment: The aluminum plate obtained from step (1) is subjected to a desmutting treatment in a desmutting solution (per 1 liter of the desmutting solution, a volume of concentrated nitric acid having a concentration of 65 wt % is 400 mL) under 20 Celsius degrees for 1 minute, and then the aluminum plate is washed twice by deionized water.

(3) Oxidizing treatment: The aluminum plate obtained from step (2) is placed in an oxidation tank so as to conduct a hard oxidizing treatment. The hard oxidizing treatment is carried out under 5 Celsius degrees with a positive square wave pulse, a duty ratio of 50%, a frequency of 500 Hz, and a current density of 2 A/dm$^2$ for 50 minutes (per 1 liter of an oxidant solution, a content of a 98 wt % sulfuric acid is 220 grams, a content of an oxalic acid is 20 grams, and remaining is water), and then the aluminum plate is washed twice by deionized water.

(4) Sealing treatment: The aluminum plate obtained from step (3) is sealed with a sealant with trace nickel under 20 Celsius degrees for 3 minutes, and then the aluminum plate is washed twice by deionized water, and then the aluminum plate is blow-dried via an oil-free compressed gas under 25 Celsius so as to obtain a hard anodic oxidation layer 1 having a thickness of 40 microns.

(5) Ink spraying treatment: A UV ink is sprayed on surface of the aluminum plate obtained from step (4) to form an ink layer 2 having a thickness of 40 microns, and then the aluminum plate is baked under 110 Celsius degrees for 30 minutes and exposed under ultraviolet ray for 1 minute.

(6) A step recess pattern is radium carved on a first surface of the aluminum plate obtained from step (5) via a radium carving machine so as to remove the ink layer and the hard anodic oxidation layer corresponding to the step recess pattern. Then, the aluminum plate is etched in an etching solution (per 1 L etching solution, a content of ferric trichloride hexahydrate is 800 grams, a content of 37 wt % hydrochloric acid is 100 mL, and remaining is water) under 20 Celsius degree for 50 minutes so as to remove a part of aluminum layer (0.4 millimeters) in a thickness direction of the aluminum plate, so as to obtain a step recess 4 having a width of 2.5 centimeters and a depth of 0.4 millimeters. And then the aluminum plate is washed twice by deionized water, and an exposed black impurity layer is peeled away, and then then the aluminum plate is washed twice by deionized water again.

(7) A UV ink is sprayed on the step recess to form an ink layer having a thickness of 30 microns and then the aluminum plate is baked under 110 Celsius degrees for 30 minutes and exposed under ultraviolet ray for 1 minute. Then, an antenna groove slit having a width of 0.02 millimeters is radium carved within the step recess so as to remove the ink layer corresponding to the antenna groove slit, an aluminum layer corresponding to the antenna groove slit is etched under 20 Celsius degrees for 35 minutes with an etching solution (per 1 liter of the etching solution, a content of ferric trichloride hexahydrate is 800 grams, a content of 37 wt % hydrochloric acid is 100 mL, and remaining is water). By observing, an inner side of the hard anodic oxidation layer coated on a second surface of the aluminum plate is exposed. Then the aluminum plate is washed twice by deionized water, and an exposed black impurity layer is peeled away, and then then the aluminum plate is washed twice by deionized water again. Then an antenna groove having a sectional structure of trapezoid that the upper opening has a size larger than that of a lower opening of the antenna groove is obtained, the upper opening has a width of 2 millimeters, and the lower opening has a width of 0.8 millimeters.

(8) The ink layer on a rear surface of the aluminum plate is removed via a chlorinated hydrocarbon solvent paint remover, and then the aluminum plate is washed twice by deionized water and baked under 80 Celsius degrees for 10 minutes.

(9) A UV glue is filled within the antenna groove.

In this Example, a sectional structure schematic view of the aluminum shell after removing the ink layer and the hard anodic oxidation layer corresponding to the step recess pattern, a sectional structure schematic view of the aluminum shell after removing part of aluminum layer to obtain the step recess, a sectional structure schematic view of the aluminum shell after radium carving the antenna groove slit and removing the ink layer corresponding to the antenna groove slit, a sectional structure schematic view of the aluminum shell after removing the ink layer, a sectional structure schematic view of the aluminum shell after forming the ink layer, a picture of the aluminum shell after radium carving the step recess pattern, a picture of the aluminum shell after etching the step recess and a picture of the aluminum shell after radium curing the antenna groove slit are the same as shown in Example 1.

The antenna groove formed on the aluminum shell according to this Example is not visible on appearance via naked eye. The appearance of the surface layer of the aluminum shell won't be damaged, the appearance surface of the aluminum shell is smooth and tidy, which may maintain a cleanliness and integrity of appearance of the phone body and will not damage a metal texture of the whole phone body.

Example 3

This Example is used to illustrate an aluminum shell having an antenna groove of a tablet computer and a method of manufacturing the same of the present disclosure.

(1) Alkaline etching treatment: A series 5 aluminum layer 3 having a thickness of 0.5 millimeters is cut to form an aluminum plate having a size of 5 centimeters*3.5 centimeters. Then the aluminum plate is subjected to an alkaline etching treatment in a potassium hydroxide solution having a concentration of 60 g/L under 70 Celsius degrees for 1 minute, and then the aluminum plate is washed twice by deionized water.

(2) Desmutting treatment: The aluminum plate obtained from step (1) is subjected to a desmutting treatment in a desmutting solution (per 1 liter of the desmutting solution, a volume of concentrated nitric acid having a concentration of 65 wt % is 200 mL) under 30 Celsius degrees for 3 minutes, and then the aluminum plate is washed twice by deionized water.

(3) Oxidizing treatment: The aluminum plate obtained from step (2) is placed in an oxidation tank so as to conduct a hard oxidizing treatment. The hard oxidizing treatment is carried out under 12 Celsius degrees with a positive square wave pulse, a duty ratio of 90%, a frequency of 1000 Hz, and a current density of 7 A/dm$^2$ for 30 minutes (per 1 liter of an oxidant solution, a content of a 98 wt % sulfuric acid is 120 grams, a content of an oxalic acid is 8 grams, and remaining is water), and then the aluminum plate is washed twice by deionized water.

(4) Sealing treatment: The aluminum plate obtained from step (3) is sealed with a sealant with trace nickel under 30 Celsius degrees for 2 minutes, and then the aluminum plate is washed twice by deionized water, and then the aluminum plate is blow-dried via an oil-free compressed gas under 25 Celsius so as to obtain a hard anodic oxidation layer 1 having a thickness of 50 microns.

(5) Ink spraying treatment: A UV ink is sprayed on surface of the aluminum plate obtained from step (4) to form an ink layer 2 having a thickness of 60 microns, and then the aluminum plate is baked under 120 Celsius degrees for 20 minutes and exposed under ultraviolet ray for 2 minutes.

(6) A step recess pattern is radium carved on a first surface of the aluminum plate obtained from step (5) via a radium carving machine so as to remove the ink layer and the hard anodic oxidation layer corresponding to the step recess pattern. Then, the aluminum plate is etched in an etching solution (per 1 L etching solution, a content of ferric trichloride hexahydrate is 1000 grams, a content of 37 wt % hydrochloric acid is 200 mL, and remaining is water) under 30 Celsius degree for 40 minutes so as to remove a part of aluminum layer (0.35 millimeters) in a thickness direction of the aluminum plate, so as to obtain a step recess 4 having a width of 2.5 centimeters and a depth of 0.35 millimeters. And then the aluminum plate is washed twice by deionized water, and an exposed black impurity layer is peeled away, and then then the aluminum plate is washed twice by deionized water again.

(7) A UV ink is sprayed on the step recess to form an ink layer having a thickness of 60 microns and then the aluminum plate is baked under 120 Celsius degrees for 20 minutes and exposed under ultraviolet ray for 2 minutes. Then, an antenna groove slit having a width of 0.1 millimeters is radium carved within the step recess so as to remove the ink layer corresponding to the antenna groove slit, an aluminum layer corresponding to the antenna groove slit is etched under 30 Celsius degrees for 30 minutes with an etching solution (per 1 liter of the etching solution, a content of ferric trichloride hexahydrate is 1000 grams, a content of 37 wt % hydrochloric acid is 200 mL, and remaining is water). By observing, an inner side of the hard anodic oxidation layer coated on a second surface of the aluminum plate is exposed. Then the aluminum plate is washed twice by deionized water, and an exposed black impurity layer is peeled away, and then then the aluminum plate is washed twice by deionized water again. Then an antenna groove having a sectional structure of trapezoid that the upper opening has a size larger than that of a lower opening of the antenna groove is obtained, the upper opening has a width of 2.5 millimeters, and the lower opening has a width of 1.0 millimeter.

(8) The ink layer on a rear surface of the aluminum plate is removed via a chlorinated hydrocarbon solvent paint remover, and then the aluminum plate is washed twice by deionized water and baked under 120 Celsius degrees for 5 minutes.

(9) A UV glue is filled within the antenna groove.

In this Example, a sectional structure schematic view of the aluminum shell after removing the ink layer and the hard anodic oxidation layer corresponding to the step recess pattern, a sectional structure schematic view of the aluminum shell after removing part of aluminum layer to obtain the step recess, a sectional structure schematic view of the aluminum shell after radium carving the antenna groove slit and removing the ink layer corresponding to the antenna groove slit, a sectional structure schematic view of the aluminum shell after removing the ink layer, a sectional structure schematic view of the aluminum shell after forming the ink layer, a picture of the aluminum shell after radium carving the step recess pattern, a picture of the aluminum shell after etching the step recess and a picture of the aluminum shell after radium curing the antenna groove slit are the same as shown in Example 1.

The antenna groove formed on the aluminum shell according to this Example is not visible on appearance via naked eye. The appearance of the surface layer of the aluminum shell won't be damaged, the appearance surface of the aluminum shell is smooth and tidy, which may maintain a cleanliness and integrity of appearance of the phone body and will not damage a metal texture of the whole phone body.

Example 4

The method in the Example is similar to that in Example 1 with exceptions that: in step (6), the aluminum plate is etched in an etching solution (per 1 L etching solution, a content of ferric trichloride hexahydrate is 900 grams, a content of 37 wt % hydrochloric acid is 150 mL, and remaining is water) under 25 Celsius degree for 20 minutes so as to remove a part of aluminum layer (0.1 millimeters) in a thickness direction of the aluminum plate, so as to obtain a step recess 4.

In this Example, a sectional structure schematic view of the aluminum shell after removing the ink layer and the hard anodic oxidation layer corresponding to the step recess pattern, a sectional structure schematic view of the aluminum shell after removing part of aluminum layer to obtain the step recess, a sectional structure schematic view of the aluminum shell after radium carving the antenna groove slit and removing the ink layer corresponding to the antenna groove slit, a sectional structure schematic view of the aluminum shell after removing the ink layer, a sectional structure schematic view of the aluminum shell after forming the ink layer, a picture of the aluminum shell after radium carving the step recess pattern, a picture of the aluminum shell after etching the step recess and a picture of the aluminum shell after radium curing the antenna groove slit are the same as shown in Example 1. The step recess formed has a width of 2.5 centimeters and a depth of 0.1 millimeters, and the upper opening of the antenna groove has a width of 5 millimeters, and the lower opening of the antenna groove has a width of 1.4 millimeter.

The antenna groove formed on the aluminum shell according to this Example is not visible on appearance via naked eye. The appearance of the surface layer of the aluminum shell won't be damaged, the appearance surface of the aluminum shell is smooth and tidy, which may maintain a cleanliness and integrity of appearance of the phone body and will not damage a metal texture of the whole phone body.

Example 5

The method in the Example is similar to that in Example 1 with exceptions that: in step (6), the aluminum plate is etched in an etching solution (per 1 L etching solution, a content of ferric trichloride hexahydrate is 900 grams, a content of 37 wt % hydrochloric acid is 150 mL, and remaining is water) under 25 Celsius degree for 15 minutes so as to remove a part of aluminum layer (0.05 millimeters) in a thickness direction of the aluminum plate, so as to obtain a step recess 4.

In this Example, a sectional structure schematic view of the aluminum shell after removing the ink layer and the hard anodic oxidation layer corresponding to the step recess pattern, a sectional structure schematic view of the aluminum shell after removing part of aluminum layer to obtain the step recess, a sectional structure schematic view of the aluminum shell after radium carving the antenna groove slit and removing the ink layer corresponding to the antenna groove slit, a sectional structure schematic view of the aluminum shell after removing the ink layer, a sectional structure schematic view of the aluminum shell after forming the ink layer, a picture of the aluminum shell after radium carving the step recess pattern, a picture of the aluminum shell after etching the step recess and a picture of the aluminum shell after radium curing the antenna groove slit are the same as shown in Example 1. The step recess formed has a width of 2.5 centimeters and a depth of 0.05 millimeters, and the upper opening of the antenna groove has a width of 6 millimeters, and the lower opening of the antenna groove has a width of 1.6 millimeter.

The antenna groove formed on the aluminum shell according to this Example is not visible on appearance via naked eye. The appearance of the surface layer of the aluminum shell won't be damaged, the appearance surface of the aluminum shell is smooth and tidy, which may maintain a cleanliness and integrity of appearance of the phone body and will not damage a metal texture of the whole phone body.

It should be well known by those skilled in the art that the smaller the width of the upper opening of the antenna groove and the lower opening of the antenna groove are, the better firmness and hardness the aluminum shell have. By comparing the Example 1 with the Examples 4 and 5, in step (6), after removing part of the aluminum layer, when the thickness of the residual aluminum layer is about 20% to about 40% of the total thickness of the aluminum layer, the width of the upper opening and the lower opening of the antenna groove formed after etching could be evidently reduced, so as to effectively improve the firmness and hardness of the aluminum shell.

Test Example

The aluminum shells obtained from Examples 1-5 are subjected to a signal shielding test, the test method is: Two conducting positions are radium curved on two parts of the aluminum shell separated by the un-visible antenna groove respectively, and then an electrical conductivity between the two conducting positions are tested. All of the test results of Examples 1-5 shown that it is non-conducting between the two conducting positions. Therefore, not only the cleanliness and integrity of appearance of the electronic product metal shell is maintained and a metal texture of the electronic product metal shell body won't be damaged, but also a signal shielding problem of the electronic product metal shell body could be well solved.

Although explanatory examples stated above have been shown and described in detail, it may be appreciated by those skilled in the art that the above examples cannot be construed to limit the present disclosure, various simple modifications could be made within technical spirit and principles of the present disclosure, those simple modifications all fall into the protection scope of the present disclosure.

In addition, it should be noted that, each specific technical feature described in the example stated above, under no contradiction, could be combined via any appropriate manner, in order to avoid unnecessary repetition, various possible combination manners are not illustrated in the present disclosure.

In addition, each different example of the present disclosure could also be combined with each other without departing from spirit and principles of the present disclosure, which should also be deemed as content of present disclosure.

What is claimed is:

1. An electronic product metal shell comprising:
    a metal layer having a first surface and a second surface;
    a hard anodic oxidation layer coated on the first surface and the second surface of the metal layer;
    a step recess formed through the hard anodic oxidation layer on the first surface of the metal layer and partially into the metal layer;
    an antenna groove disposed within the step recess and extending through the metal layer to expose an inner side of the hard anodic oxidation layer on the second surface of the metal layer; and a non-conductive material filled in the antenna groove.

2. The electronic product metal shell of claim 1, wherein the step recess has a width of about 1.0 centimeter to about 5.0 centimeters and a depth of about 0.1 millimeters to about 0.8 millimeters, preferably a depth of about 0.3 millimeters to about 0.5 millimeters.

3. The electronic product metal shell of claim 1, wherein an opening of the antenna groove facing a first surface of the electronic product metal shell is defined as an upper opening, the antenna groove has a sectional structure of trapezoid that the upper opening has a size larger than a lower opening of the antenna groove, the upper opening has a width of about 2 millimeters to about 5 millimeters, preferably about 2 millimeters to about 5 millimeters, and the lower opening has a width of about 0.8 millimeters to about 1.4 millimeters, preferably about 0.8 millimeters to about 1.2 millimeters.

4. The electronic product metal shell of claim 1, wherein the metal layer has a thickness of about 0.5 millimeters to about 1.5 millimeters, and the hard anodic oxidation layer has a thickness of about 0.02 millimeters to about 0.06 millimeters.

5. The electronic product metal shell of claim 1, wherein the metal layer includes an aluminum alloy layer.

6. The electronic product metal shell of claim 1, wherein the electronic product metal shell includes a cell phone metal shell or a tablet computer metal shell.

7. A method of manufacturing an electronic product metal shell, comprising steps of:
applying a hard anodizing treatment and an ink spraying treatment to a metal layer in sequence, so as to form a hard anodic oxidation layer and an ink layer respectively;
forming a step recess through the hard anodic oxidation layer on a first surface of the metal layer and partially into the metal layer, and an antenna groove disposed within the step recess and extending through the metal layer to expose an inner side of the hard anodic oxidation layer on a second surface of the metal layer;
removing the ink layer; and
filling a non-conductive material in the antenna groove.

8. The method of claim 7, wherein in step, the forming the step recess comprises: forming a step recess pattern on the first surface of the metal shell, removing the ink layer and the hard anodic oxidation layer corresponding to the step recess pattern, and removing a first part of the metal layer to obtain the step recess.

9. The method of claim 8, wherein after removing the first part of the metal layer, the remaining part of the metal layer has a thickness of about 20% to about 80% of an overall thickness of the metal layer.

10. The method of claim 8, wherein the first part of the meal layer is removed via etching, the etching is carried out under a temperature of about 20 Celsius degrees to about 30 Celsius degrees for about 40 minutes to about 50 minutes, with an etching solution including an aqueous solution having ferric trichloride and hydrochloric acid, and per one liter of the etching solution, the ferric trichloride has a content of about 800 grams to about 1000 grams, and the hydrochloric acid has a content of about 35 grams to about 75 grams.

11. The method of claim 7, wherein in step, the forming the antenna groove within the step recess includes: spraying ink on the step recess, forming an antenna groove slit within the step recess to remove the ink corresponding to the antenna groove slit, and removing the metal layer corresponding to the antenna groove slit to expose the inner side of the hard anodic oxidation layer coated on the second surface of the metal layer.

12. The method of claim 11, wherein spraying ink includes: spraying a UV ink to form an ink layer having a thickness of about 30 microns to about 60 microns, then baking the electronic product metal shell under about 110 Celsius degrees to about 120 Celsius degrees for about 20 minutes to about 30 minutes, and exposing the electronic product metal shell under ultraviolet ray for about 1 minute to about 2 minutes.

13. The method of claim 11, wherein the antenna groove slit formed has a width of about 0.02 millimeters to about 0.1 millimeters.

14. The method of claim 11, wherein the metal layer corresponding to the antenna groove slit is removed via etching, the etching is carried out under a temperature of about 20 Celsius degrees to about 30 Celsius degrees for about 40 minutes to about 50 minutes, with an etching solution including an aqueous solution having ferric trichloride and hydrochloric acid, and per one liter of the etching solution, the ferric trichloride has a content of about 800 grams to about 1000 grams, and the hydrochloric acid has a content of about 35 grams to about 75 grams.

15. The method of claim 7, wherein in step, applying the hard anodizing treatment comprises: applying an alkaline etching treatment, a desmutting treatment, a oxidizing treatment and a sealing treatment to the metal layer in sequence, and washing the metal layer after each one of the alkaline etching treatment, the desmutting treatment, the oxidizing treatment and the sealing treatment respectively, preferably, the oxidizing treatment is carried out under a condition of: a temperature of about 5 Celsius degrees to about 12 Celsius degrees for about 30 minutes to about 50 minutes, an impulse waveform of positive square wave pulse, a duty ratio of about 50% to about 90%, a frequency of about 500 Hz to about 1000 Hz, a current density of about 2 A/dm$^2$ to about 7 A/dm$^2$, an oxidant solution including an aqueous solution of sulfuric acid, oxalic acid/malic acid, wherein per 1 liter of the oxidant solution, the sulfuric acid has a content of about 120 grams to 220 grams, the oxalic acid or the malic acid has a content of about 8 grams to about 20 grams.

16. The method of claim 7, wherein in step applying the ink spraying treatment comprises: spraying a UV ink to form a ink layer having a thickness of about 40 microns to about 60 microns, baking the electronic product metal shell under about 110 Celsius degrees to about 120 Celsius degrees for about 20 minutes to about 30 minutes, and exposing the electronic product metal shell under ultraviolet ray for about 1 minute to about 2 minutes.

17. The method of claim 7, wherein in step removing the ink layer, the ink layer is removed by a neutral paint remover.

18. The method of claim 7, wherein the non-conductive material includes at least one selected from a group consisting of UV glue, thermal curing glue, and cold setting adhesive.

19. The method of claim 7, wherein the metal layer includes an aluminum alloy layer.

20. The method of claim 7, wherein the electronic product metal shell includes a cell phone metal shell or a tablet computer metal shell.

* * * * *